(12) United States Patent
Bergsma

(10) Patent No.: US 11,454,657 B2
(45) Date of Patent: Sep. 27, 2022

(54) COMPENSATED POWER DETECTOR

(71) Applicant: SKYWORKS SOLUTIONS, INC., Woburn, MA (US)

(72) Inventor: Adrian John Bergsma, Kanata (CA)

(73) Assignee: Skyworks Solutions, Inc., Irvine, CA (US)

( * ) Notice: Subject to any disclaimer, the term of this patent is extended or adjusted under 35 U.S.C. 154(b) by 309 days.

(21) Appl. No.: 16/435,866

(22) Filed: Jun. 10, 2019

(65) Prior Publication Data

US 2019/0377014 A1 Dec. 12, 2019

Related U.S. Application Data

(60) Provisional application No. 62/682,972, filed on Jun. 10, 2018.

(51) Int. Cl.
*G01R 21/14* (2006.01)
*H03F 3/45* (2006.01)
*H03F 3/195* (2006.01)
*H01L 23/66* (2006.01)
*H04B 17/20* (2015.01)

(52) U.S. Cl.
CPC ............. *G01R 21/14* (2013.01); *H01L 23/66* (2013.01); *H03F 3/195* (2013.01); *H03F 3/4508* (2013.01); *H04B 17/20* (2015.01); *H01L 2223/6644* (2013.01); *H01L 2223/6677* (2013.01); *H03F 2200/105* (2013.01); *H03F 2200/451* (2013.01)

(58) Field of Classification Search
CPC ......... G01R 21/12; G01R 21/14; H03F 3/195; H03F 3/4508; H03F 2200/451
See application file for complete search history.

(56) References Cited

U.S. PATENT DOCUMENTS

2009/0302830 A1\* 12/2009 Kobayashi ............. G01R 21/12
324/105

\* cited by examiner

*Primary Examiner* — Amy He
(74) *Attorney, Agent, or Firm* — Chang & Hale LLP

(57) ABSTRACT

In some embodiments, a compensated power detector can include a power detector that includes a first detection cell having a bias input and an output, and a second detection cell having a signal input, a bias input and an output. The power detector can further include an error amplifier having a first input coupled to the output of the first detection cell, and a second input for receiving a reference voltage. The error amplifier can be configured to provide an output voltage to each of the bias inputs of the first and second detection cells, such that an output of the second detection cell is representative of power of a radio-frequency signal received at the signal input with an adjustment for one or more non-signal effects as measured by the first detection cell and the error amplifier.

14 Claims, 12 Drawing Sheets

COMPENSATED POWER DETECTOR

CROSS-REFERENCE TO RELATED APPLICATION(S)

This application claims priority to U.S. Provisional Application No. 62/682,972 filed Jun. 10, 2018, entitled COMPENSATED POWER DETECTOR, the disclosure of which is hereby expressly incorporated by reference herein in its respective entirety.

BACKGROUND

Field

The present disclosure relates to power detection circuits, related devices, and related methods for radio-frequency (RF) applications.

Description of the Related Art

In many radio-frequency (RF) applications, it is desirable to accurately measure the power of a signal. Such a signal can be a signal to be transmitted or a received signal. Such a measurement can provide information about performance of one or more operating parameters associated with an RF system, and/or allow an RF system to be adjusted.

Often, power detection circuits can be sensitive to factors such as process variation and temperature in such a way as to decrease the overall accuracy of the power measurement.

SUMMARY

In accordance with some implementations, the present disclosure relates to a power detector that includes a first detection cell having a bias input and an output, and a second detection cell having a signal input, a bias input and an output. The power detector further includes an error amplifier having a first input coupled to the output of the first detection cell, and a second input for receiving a reference voltage. The error amplifier is configured to provide an output voltage to each of the bias inputs of the first and second detection cells, such that an output of the second detection cell is representative of power of a radio-frequency signal received at the signal input with an adjustment for one or more non-signal effects as measured by the first detection cell and the error amplifier.

In some embodiments, the first detection cell can further include a signal input that is not provided with a radio-frequency signal. The first detection cell and the second detection cell can be substantially identical.

In some embodiments, each of the first detection cell and the second detection cell can include a power detection circuit based on bipolar junction transistors. Each of the first detection cell and the second detection cell can include an emitter follower power detection circuit. The emitter follower power detection circuit can be configured such that the bias input and the signal input are coupled to a base of the respective bipolar junction transistor. The emitter follower power detection circuit can be further configured such that the output is coupled to an emitter of the respective bipolar junction transistor. The emitter follower power detection circuit can be further configured such that a collector of the respective bipolar junction transistor is coupled to a supply voltage source.

In some embodiments, the error amplifier can include a first transistor having a base coupled to the first input, a collector coupled to a supply circuit, and an emitter. The error amplifier can further include a second transistor having a base coupled to the second input, a collector coupled to the supply circuit, and an emitter coupled to the emitter of the first transistor. The collector of the second transistor can be configured to provide the output voltage of the error amplifier. The error amplifier can further include an output capacitance that couples the collector of the second transistor to ground.

In some embodiments, the supply circuit can include a first transistor and a second transistor each having a source, a gate and a drain, with the source of each of the first and second transistors coupled to a regulated voltage node, the gates of the first and second transistors coupled to each other and to the drain of the first transistor. The drain of the first transistor of the supply circuit can be coupled to the collector of the first transistor of the error amplifier, and the drain of the second transistor of the supply circuit can be coupled to the collector of the second transistor of the error amplifier.

In some embodiments, the reference voltage can include a regulated voltage based on a bandgap voltage. In some embodiments, the one or more non-signal effects can include either or both of a temperature variation and a process variation.

In some teachings, the present disclosure relates to a semiconductor die that includes a semiconductor substrate and a power detector implemented on the semiconductor substrate. The power detector includes a first detection cell having a bias input and an output, and a second detection cell having a signal input, a bias input and an output. The power detector further includes an error amplifier having a first input coupled to the output of the first detection cell, and a second input for receiving a reference voltage. The error amplifier is configured to provide an output voltage to each of the bias inputs of the first and second detection cells, such that an output of the second detection cell is representative of power of a radio-frequency signal received at the signal input with an adjustment for one or more non-signal effects as measured by the first detection cell and the error amplifier.

In some implementations, the present disclosure relates to a packaged module that includes a packaging substrate configured to receive a plurality of components. The packaged module further includes a power detector implemented on the packaging substrate. The power detector includes a first detection cell having a bias input and an output, and a second detection cell having a signal input, a bias input and an output. The power detector further includes an error amplifier having a first input coupled to the output of the first detection cell, and a second input for receiving a reference voltage. The error amplifier is configured to provide an output voltage to each of the bias inputs of the first and second detection cells, such that an output of the second detection cell is representative of power of a radio-frequency signal received at the signal input with an adjustment for one or more non-signal effects as measured by the first detection cell and the error amplifier.

In some embodiments, the packaged module can further include a radio-frequency circuit associated with the radio-frequency signal. In some embodiments, both of the power detector and the radio-frequency circuit can be implemented on a single semiconductor die. In some embodiments, the power detector can be implemented on a first semiconductor die, and the radio-frequency circuit can be implemented on a second semiconductor die.

In a number of implementations, the present disclosure relates to a wireless device that includes a radio circuit and an antenna. The wireless device further includes a power detector having a first detection cell having a bias input and an output, and a second detection cell having a signal input, a bias input and an output. The power detector further includes an error amplifier having a first input coupled to the output of the first detection cell, and a second input for receiving a reference voltage. The error amplifier is configured to provide an output voltage to each of the bias inputs of the first and second detection cells, such that an output of the second detection cell is representative of power of a radio-frequency signal received at the signal input with an adjustment for one or more non-signal effects as measured by the first detection cell and the error amplifier.

For purposes of summarizing the disclosure, certain aspects, advantages and novel features of the inventions have been described herein. It is to be understood that not necessarily all such advantages may be achieved in accordance with any particular embodiment of the invention. Thus, the invention may be embodied or carried out in a manner that achieves or optimizes one advantage or group of advantages as taught herein without necessarily achieving other advantages as may be taught or suggested herein.

DETAILED DESCRIPTION OF SOME EMBODIMENTS

The headings provided herein, if any, are for convenience only and do not necessarily affect the scope or meaning of the claimed invention.

Power detectors are used in a variety of radio-frequency (RF) systems, circuits, etc., to measure power of an RF signal transmitted or received. Often, detector circuits are sensitive to process variation and temperature in such a way as to decrease the overall accuracy of the measurement.

To address temperature effects, some detectors have special bias circuits that compensate for temperature changes in a detector cell. Some detector designs accept that temperature has a somewhat linear relationship, and the detection system adds in a mathematical offset when interpreting the output voltage of the detector. For process variation, some detectors use a differential structure or a reference voltage to compare measurements. Other designs incorporate a method to digitally correct for errors of offsets using fuses or other means during ATE testing.

Figure 1:
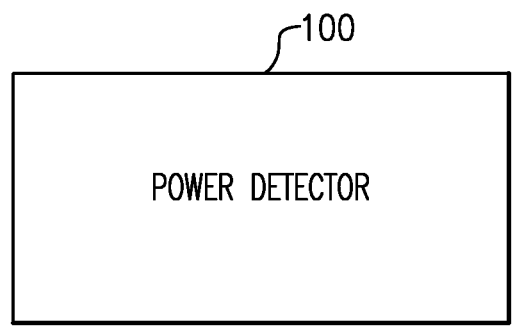
FIG. 1 depicts a power detector having one or more features as described herein.

FIG. 1 shows that in some implementations, the present disclosure relates to a power detector 100 having one or more features as described herein. In some embodiments, such a power detector can be configured to use a temperature and process stable voltage reference and a feedback loop to track out process and temperature effects in a main cell. The resulting corrective voltage that is used in the main cell can then be used in an auxiliary cell, implemented as a main power detector cell, that tracks the main cell and effectively cancels out or greatly reduces both the temperature and process variations for the main detector cell.

It will be understood that one or more features of the present disclosure can also be implemented in a power detection system where the main cell (that is part of the feedback look) is utilized as a power detector cell. It will also be understood that one or more features of the present disclosure can also be implemented in a power detection system having a plurality of auxiliary cells, with each auxiliary cell being utilized as a respective power detector cell.

In some embodiments, a power detector having one or more features as described herein can significantly reduce the sensitivity of the detector to either or both of process and temperature variations. In some embodiments, a power detector having one or more features as described herein can be implemented so as to not require any offset correction at ATE testing stage(s). In some embodiments, a power detector having one or more features as described herein can be configured such that any remaining temperature offset due to signal only can also be corrected for.

Some of the examples are described herein in the context of bipolar-junction transistor (BJT) process technologies. However, it will be understood that one or more features of the present disclosure can be implemented in other process technologies, more specific type of BJT, etc., including, for example, CMOS technologies, GaAs technologies, etc.

Figure 2:
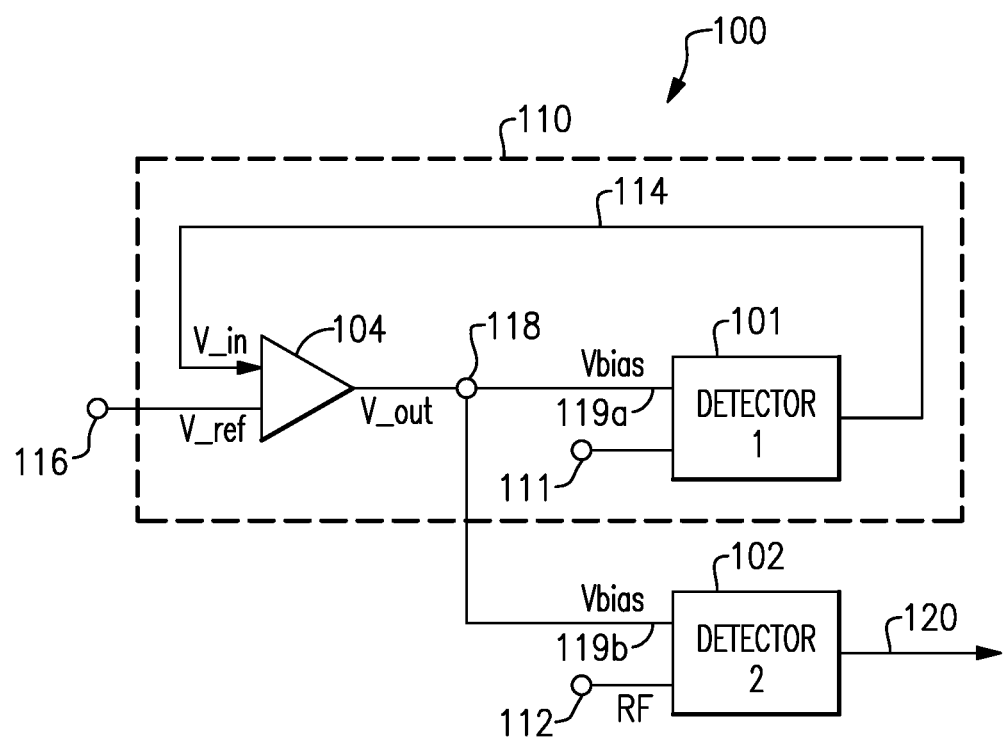
FIG. 2 show a more specific example of the power detector of FIG. 1.

FIG. 2 depicts a block diagram of a power detector 100 having one or more features as described herein. Such a power detector can include a first detector 101 that can be utilized as a main cell, and a second detector 102 that can be utilized as an auxiliary cell and a power detection cell.

In the example of FIG. 2, the first detector 101 is shown to be provided with a bias voltage (Vbias), through a path 119a, that affects the operation of the first detector 101. A signal input 111 of the first detector 101, however, is not provided with a signal. Thus, the output of the first detector 101 includes one or more effects associated with the power detector 100, other than an effect associated with the signal itself.

In the example of FIG. 2, the output of the first detector 101 is shown to be provided (through a path 114) to an error amplifier 104 such as an op amp, as a first input (V_in). The error amplifier 104 is also shown to be provided with a reference voltage (V_ref) as a second input, from a reference voltage node 116. Examples related to such a reference voltage are described herein in greater detail.

In some embodiments, the error amplifier 104 can be configured to compare the input voltage (V_in) and the reference voltage (V_ref), and generate an output voltage (V_out) at a bias node 118. Such an output voltage (V_out), or some voltage based on the output voltage (V_out), can be provided to the first detector 101 as a bias voltage (Vbias), through the path 119a, to adjust the operation of the first detector 101. Such an adjustment of the operation of the first detector 101 can result in the output of the first detector 101 being adjusted to or towards a desired voltage. For example, such a desire voltage output by the first detector 101 can be the same as the reference voltage (V_ref).

In the example of FIG. 2, the foregoing output of the first detector 101 is provided back to the error amplifier 104 through the path 114, thereby forming a feedback loop 110.

In the example of FIG. 2, the output (V_out) of the error amplifier 104, or some voltage based on the output voltage (V_out), is also shown to be provided to a second detector 102, through a path 119b, as a bias voltage (Vbias) to adjust the operation of the second detector 102. In some embodiments, the first and second detectors 101, 102 can be similar and be located sufficiently close to each other, such that the one or more non-signal effects that impact the first detector 101 also impact the second detector 102 in a similar manner.

In the example of FIG. 2, the second detector 102 is shown to be utilized as a power detection cell. Accordingly, an RF signal is shown to be provided to the second detector 102 from a signal node 112. Such a RF signal can be a signal itself being processed in an RF system, or a sampled portion of the signal.

In the example of FIG. 2, the second detector 102 generates an output 120 that is representative of the power of the input RF signal. Such a detected output includes the adjustment resulting from the feedback loop 110 described herein.

In some embodiments, the first and second detectors 101, 102 can be substantially identical to each other, other than the absence of input signal in the first detector 101 and the presence of the RF signal in the second detector 102.

Figure 3:
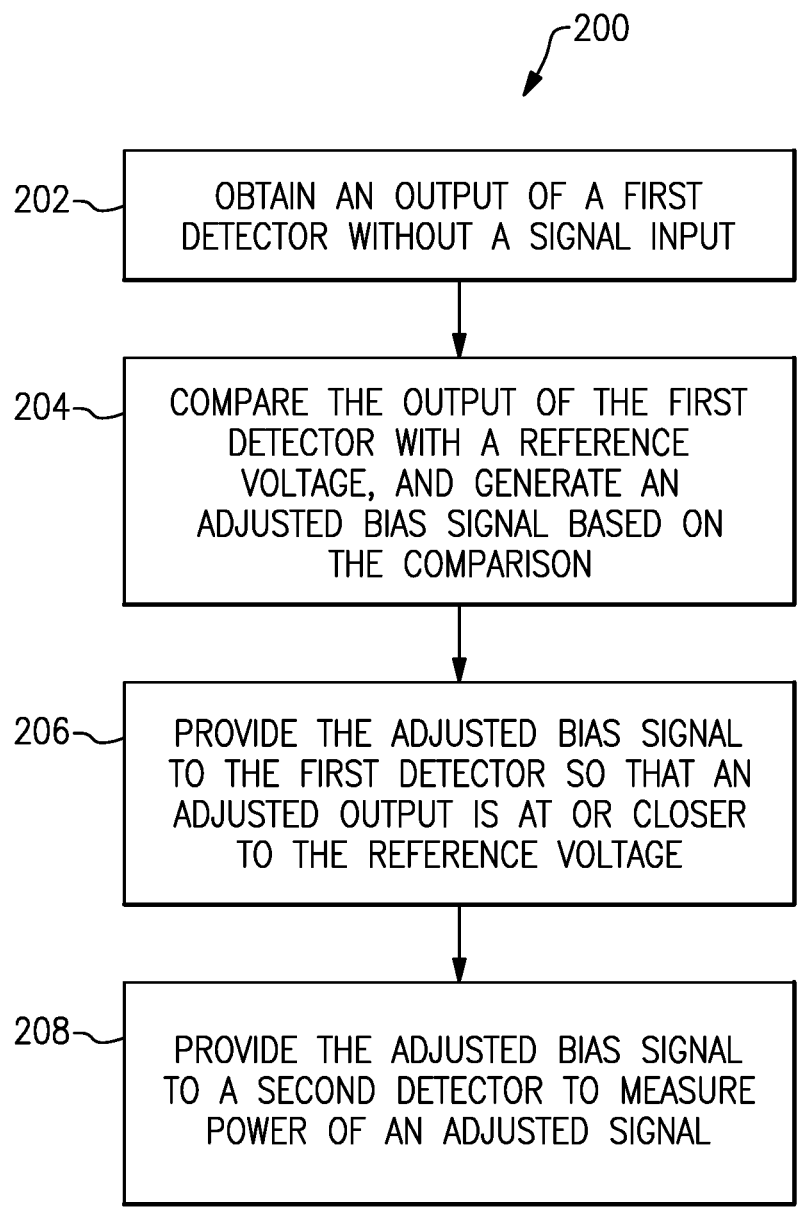
FIG. 3 shows a process that can be implemented with the power detector of FIG. 2.

FIG. 3 shows a process 200 that can be implemented with the power detector 100 of FIG. 2. In block 202, an output of a first detector can be obtained, without a signal input. In block 204, the output of the first detector can be compared with a reference voltage, and based on such a comparison, an adjusted bias signal can be generated. In block 206, the adjusted bias signal can be provided to the first detector so that an adjusted output of the first detector is at or closer to the reference voltage. In block 208, the adjusted bias signal can be provided to a second detector that is being utilized to measure power of an input signal.

Figure 4:
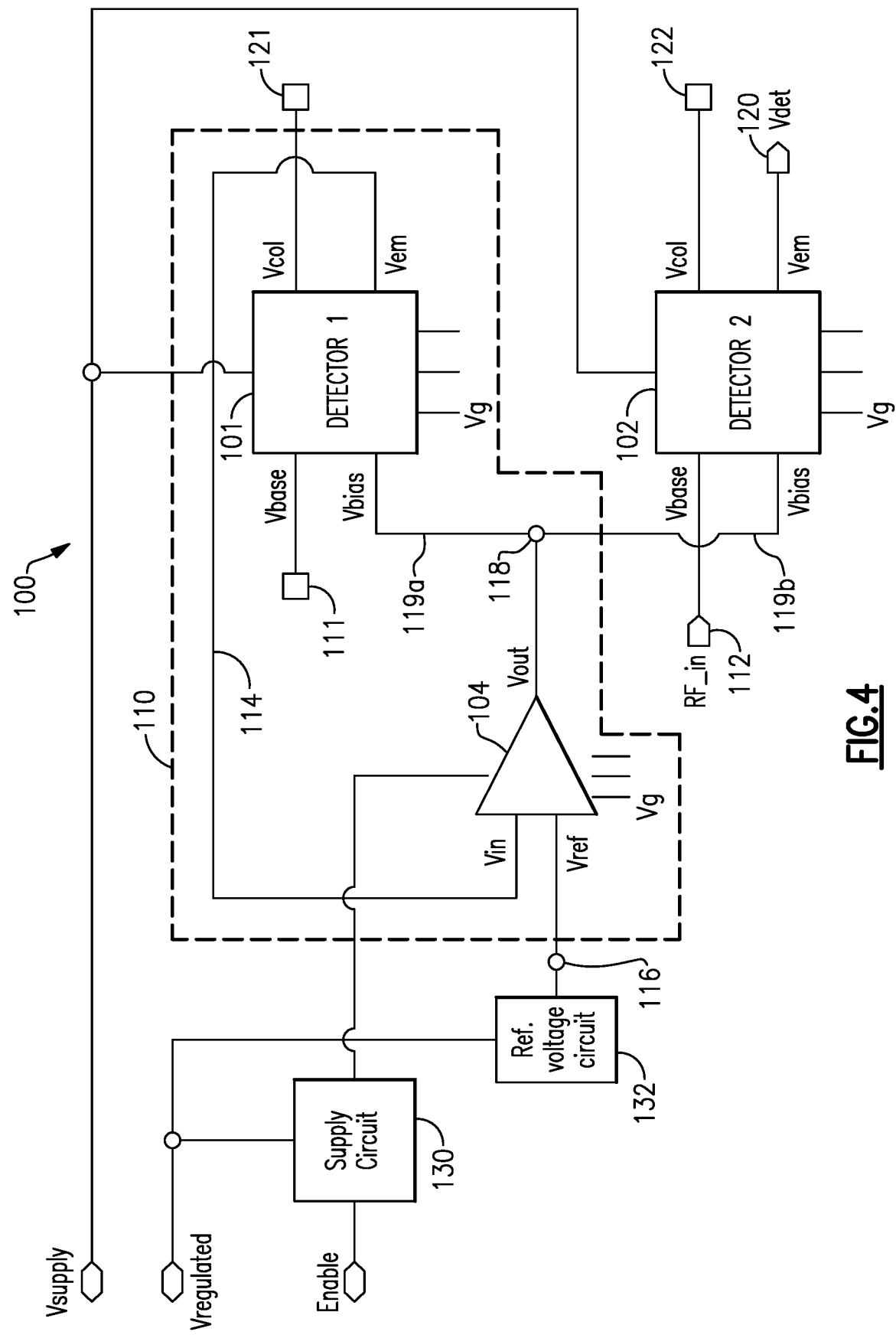
FIG. 4 shows a more detailed example of the power detector of FIG. 2.
Figure 5:
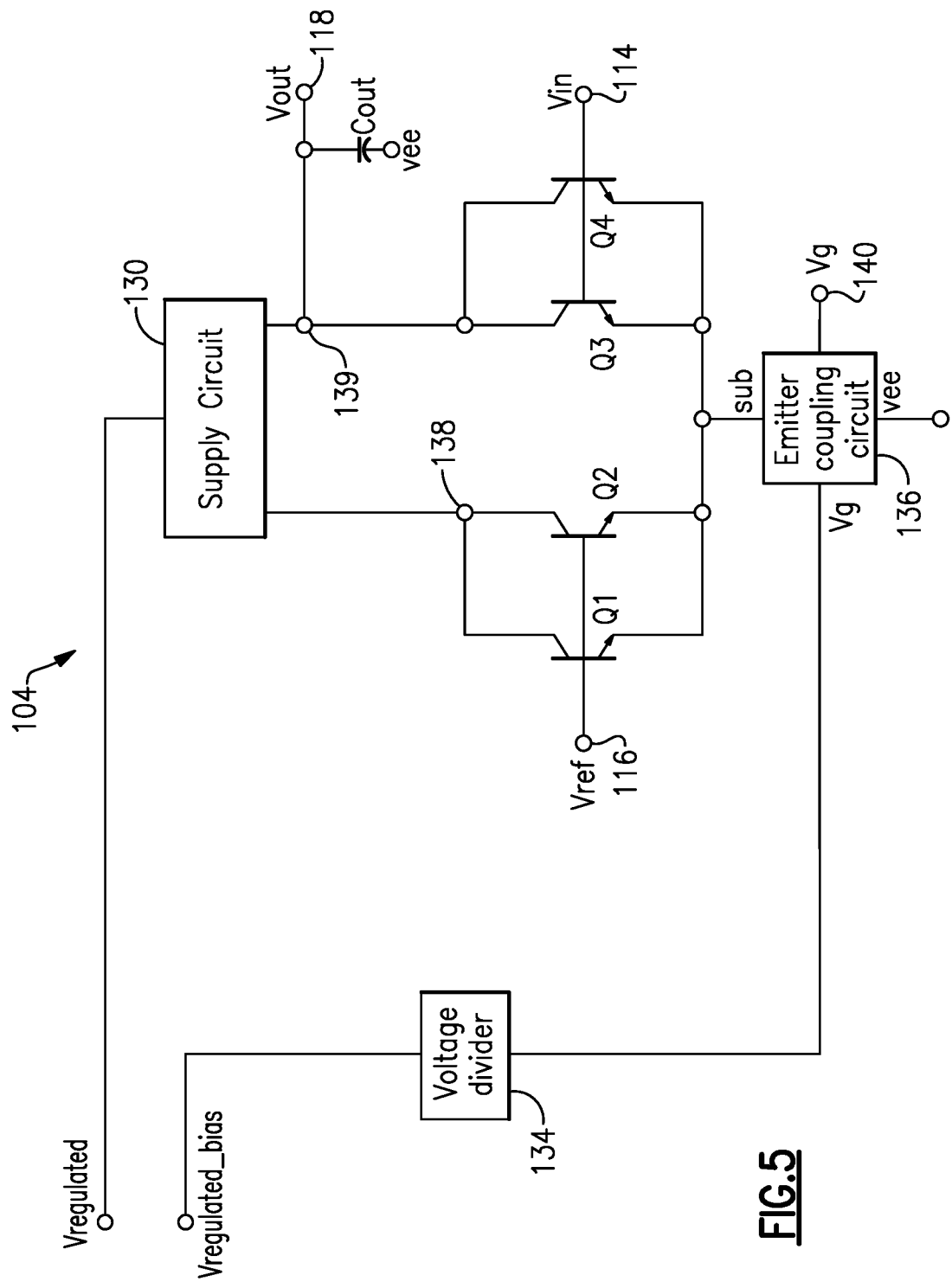
FIG. 5 shows an example of an op amp that can be implemented in the power detector of FIG. 4.
Figure 6:
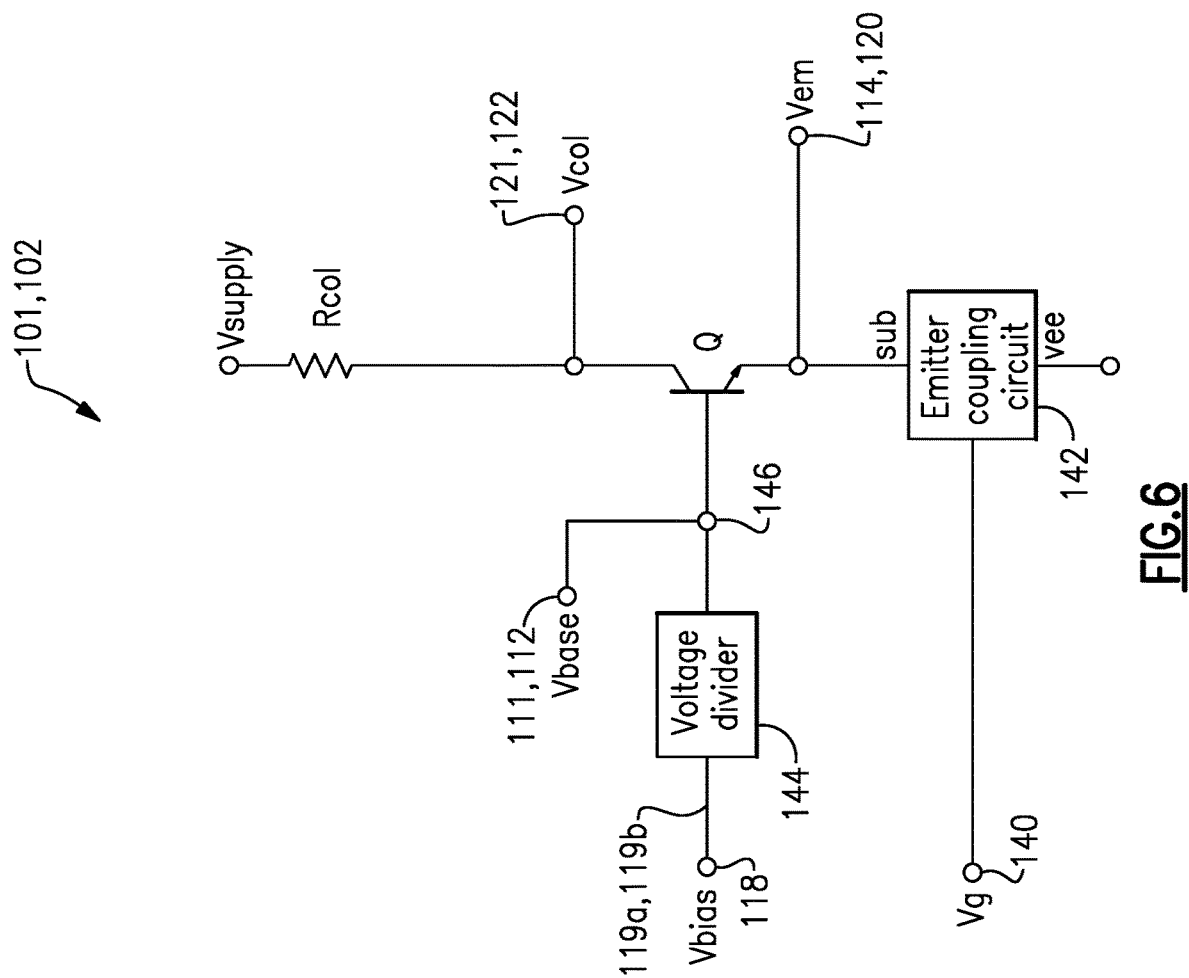
FIG. 6 shows an example of an emitter follower detector circuit that can be utilized in the power detector of FIG. 4.

FIG. 4 shows a more detailed example of the power detector 100 of FIG. 2. FIG. 4 shows that in some embodiments, each of the first detector 101 and the second detector 102 can be an emitter follower (EF) detector, and the error amplifier 104 can be an op amp. FIG. 5 shows an example of the op amp 104 that can be utilized in the power detector 100 of FIG. 4, and FIG. 6 shows an example of the EF detector (101, 102) that can be utilized in the power detector 100 of FIG. 4.

In the example of FIG. 4, the feedback loop described in reference to FIG. 3 is indicated as 110, and other nodes, paths, etc. share the same reference numerals as in FIG. 3.

In the example of FIG. 4, the reference voltage node 116 is shown to be coupled to a voltage node associated with a regulated voltage (Vregulated). In some embodiments, such a regulated voltage can be, for example, a bandgap voltage or a regulated voltage based on bandgap voltage. In some embodiments, such a regulated voltage can be, for example, 2.5V. Such a regulated voltage can be passed through a voltage divider so as to provide a desired value for the reference voltage at the node 116.

In the example of FIG. 4, the error amplifier 104 can be provided with a supply voltage through a supply circuit 130. In some embodiments, such a supply circuit can be operated based on an enable signal (e.g., from an Enable signal node). An example of the supply circuit is described herein in greater detail.

In the example of FIG. 4, and as described in reference to FIG. 3, the error amplifier 104 can be provided with a voltage from the first detector 101 and the reference voltage from the node 116 as inputs. Such a voltage from the first detector 101 can be an emitter voltage Vem associated with the first detector 101 provided through the feedback path 114.

In the example of FIG. 4, the error amplifier 104 can provide an output voltage Vout at the node 118, and such an output voltage can be provided to the first detector 101 through the path 119a, as a bias voltage Vbias. Such a bias voltage, based on the comparison of the emitter voltage Vem and the reference voltage Vref, can allow the first detector 101 to operate and generate an adjusted emitter voltage Vem that is at or closer to the reference voltage Vref.

In the example of FIG. 4, the output voltage Vout of the error amplifier 104 can also be provided to the second detector 102 through the path 119b, as a bias voltage Vbias. Such a bias voltage provided to the second detector 102 can allow the second detector 102 to desirably operate in a compensated manner with effects of one or more operating parameters compensated by the feedback loop involving the first detector 101.

In the example of FIG. 4, each of the first detector 101 and the second detector 102 can be operated with a supply voltage (Vsupply) from a supply node.

For the first detector 101, a signal is not provided for the signal input 111; accordingly, the signal input 111 can remain unconnected. For the first detector 101, a collector node (Vcol) can also remain unconnected.

For the second detector 102, an RF signal, or a sample of an RF signal, is provided for the signal input 112 so as to allow measurement of power associated with the RF signal in the form of an emitter voltage Vem. For the second detector 102, a collector node (Vcol) can be provided with a filter capacitance.

Configured in the foregoing manner, the bias voltage Vbias provided to each of the first and second detectors 101, 102 can have effects of one or more operating parameters compensated by the feedback loop involving the first detector 101. Accordingly, the measured power in the form of emitter voltage Vem in the second detector 102 can desirably have effects of such one or more operating parameters removed or reduced.

FIG. 5 shows an example of the error amplifier 104 described in reference to FIG. 4. It is noted that such an error amplifier design allows for minimal or reduced offsets, improved frequency behavior, improved stability, and/or sufficient gain for the error amplification application as described herein. It is further noted that an internal capacitor can be utilized for stability of the opamp as well as for separation of the RF signal from the control loop (110 in FIG. 4).

In the example of FIG. 5, the error amplifier 104 is shown to include a first group of one or more transistors (e.g., transistors Q1, Q2) implemented to receive the reference voltage Vref from node 116, and a second group of one or more transistors (e.g., transistors Q3, Q4) implemented to receive the feedback voltage Vin from the feedback path 114. More particularly, the reference voltage Vref is shown to be provided to the base of each of Q1 and Q2, and the feedback voltage Vin is shown to be provided to the base of each of Q3 and Q4.

In the example of FIG. 5, the collectors of Q1 and Q2 are shown to be connected at a common collector node 138, and the collectors of Q3 and Q4 are shown to be connected at a common collector node 139. The common collector node 138 and the common collector node 139 are shown to be provided with supply voltages from a supply circuit 130 based on a regulated voltage Vregulated. An example of such a supply circuit is described herein in greater detail.

Configured in the foregoing manner, an output voltage Vout resulting from the comparison of Vref and Vin can be provided at the common collector node 139. In FIG. 5, the output node 118 associated with Vout is shown to be connected to the common collector node 139. In some embodiments, an output capacitance Cout can be provided as shown, to provide stability as well as separation of RF signal components from the feedback loop associated with Vin.

In the example of FIG. 5, emitters of Q1, Q2, Q3, Q4 can be connected together at a common node, and such a common node can be coupled to, for example, a ground through an emitter coupling circuit 136. Such an emitter coupling circuit can be enabled with a bias voltage Vg that is based on a regulated voltage Vregulated_bias. In FIG. 5, such a regulated voltage is shown to be passed through a voltage divider 134 to reduce the voltage level of Vg. An example of the emitter coupling circuit 136 is described herein in greater detail. In the example of FIG. 5, the bias voltage Vg can also be provided to the first and second detectors (101, 102) through a node 140.

FIG. 6 shows an example of the emitter follower (EF) detector 101, 102 described in reference to FIG. 4. It is noted that such an EF detector provides a relatively simple circuit with well known behavior over different signal levels. It is also noted that a small detector capacitor can be provided to allow for maximum or increased flexibility of time constants as well as to minimize or reduce current spikes due to envelope of an RF signal being detected.

In the example of FIG. 6, the emitter follower detector 101, 102 can include a transistor Q implemented to receive a bias voltage Vbias from the output of the error amplifier (104 in FIGS. 2, 4, 5) through the node 118. For the emitter follower detector implemented as a first detector (101 in FIG. 4), the bias voltage Vbias is received through the path 119a. For the emitter follower detector implemented as a second detector (102 in FIG. 4), the bias voltage Vbias is received through the path 119b.

FIG. 6 shows that in some embodiments, the voltage level of the bias voltage Vbias can be reduced by a voltage divider 144 before being provided to the base of the transistor Q.

In the example of FIG. 6, the base (node 146) of the transistor Q is also shown to be coupled to an input node 111, 112. For the emitter follower detector implemented as a first detector (101 in FIG. 4), the input node 111 does not receive an RF signal. For the emitter follower detector implemented as a second detector (102 in FIG. 4), the input node 112 receives an RF signal.

In the example of FIG. 6, the collector of the transistor Q is also shown to be coupled to a collector node 121, 122 (Vcol). As described herein in reference to FIG. 4, the collector node 121 can remain unconnected for the emitter follower detector implemented as a first detector (101 in FIG. 4). For the emitter follower detector implemented as a second detector (102 in FIG. 4), the collector node 122 can be provided with a filter capacitance.

In the example of FIG. 6, the emitter of the transistor Q is shown to be coupled to a detector output node 114, 120 (Vem). For the emitter follower detector implemented as a first detector (101 in FIG. 4), the detector output node 114 is coupled to the error amplifier 104 through the feedback path 114. For the emitter follower detector implemented as a second detector (102 in FIG. 4), the detector output node 120 provides an output representative of the measured power associated with the RF signal provided at the base of the transistor Q.

In the example of FIG. 6, the emitter of Q can be coupled to, for example, a ground through an emitter coupling circuit 142. Such an emitter coupling circuit can be enabled with a bias voltage Vg (received through a node 140) described herein in reference to FIG. 5.

Figure 7:
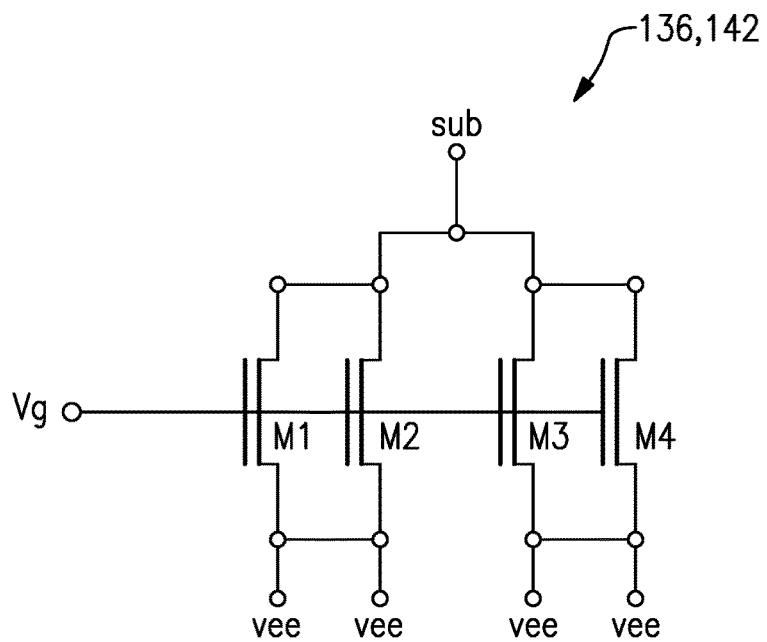
FIG. 7 shows an example of an emitter coupling circuit that can be utilized for the emitter follower detector circuit of FIG. 6.

FIG. 7 shows an example of an emitter coupling circuit 136, 142 of FIGS. 5 and 6. In the example of FIG. 7, a node indicated as "sub" can be coupled to one or more emitters, and a node indicated as "vee" can be coupled to a ground.

In the example of FIG. 7, four transistors M1, M2, M3, M4 are provides; however, it will be understood that other numbers of transistors can be utilized. The source node of each transistor is shown to be coupled to the "sub" node, the drain node of each transistor is shown to be coupled to the "vee" node, and the gate of each transistor is shown to be provided with the bias voltage Vg. Accordingly, application of the bias voltage Vg can result in the coupling circuit 136, 142 providing an emitter coupling functionality.

Figure 8:
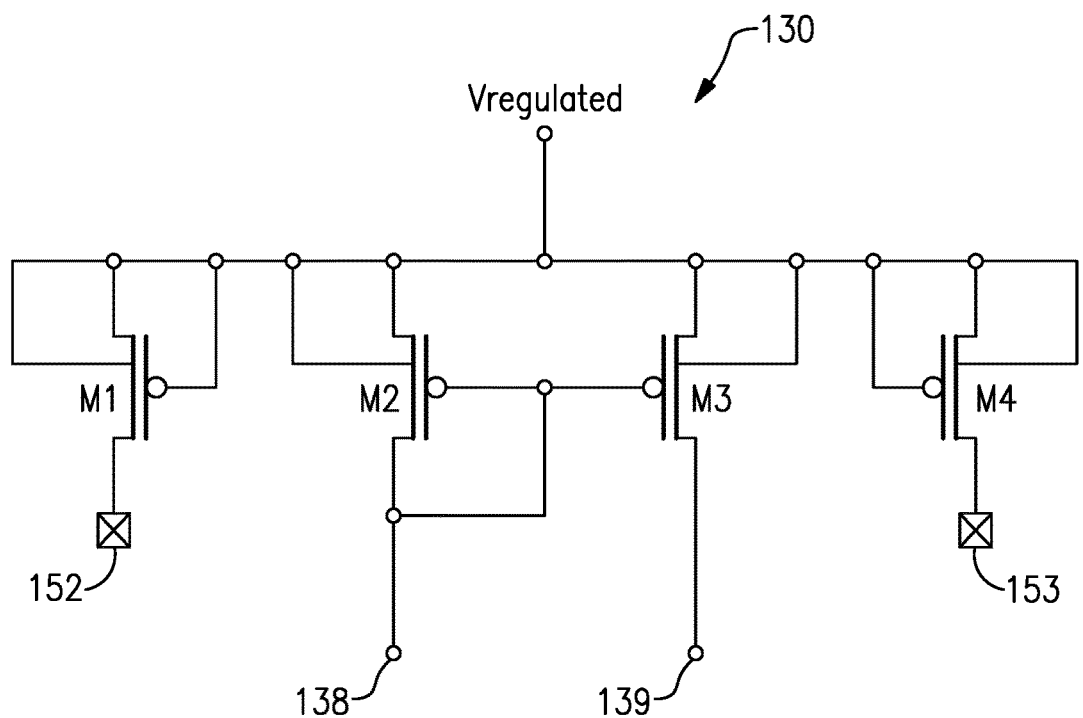
FIG. 8 shows an example of a supply circuit that can be utilized for the op amp of FIG. 5.

FIG. 8 shows an example of a supply circuit 130 of FIG. 5. In some embodiments, such a supply circuit can provide a supply voltage from a regulated voltage source (Vregulated) to the collector nodes 138, 139 of the error amplifier 104.

In the example of FIG. 8, four transistors M1, M2, M3, M4 are provides; however, it will be understood that other numbers of transistors can be utilized. The source node of each transistor is shown to be coupled to the regulated voltage source (Vregulated). The drain of M1 is shown to be coupled to an unconnected node 152, and the drain of M4 is shown to be coupled to an unconnected node 153. The drain of M2 is shown to be coupled to the collector node 138 (associated with the transistors Q1, Q2 of FIG. 5), and the drain of M3 is shown to be coupled to the collector node 139 (associated with the transistors Q3, Q4 of FIG. 5).

In the example of FIG. 8, the source of each transistor is shown to be coupled to the body. The source of M1 is shown to be coupled to its gate. Similarly, the source of M4 is shown to be coupled to its gate. The gate of M2 is shown to be coupled to the gate of M3, and such a coupled gate (M2 and M3) is shown to be coupled to the drain of M2.

Figure 9:
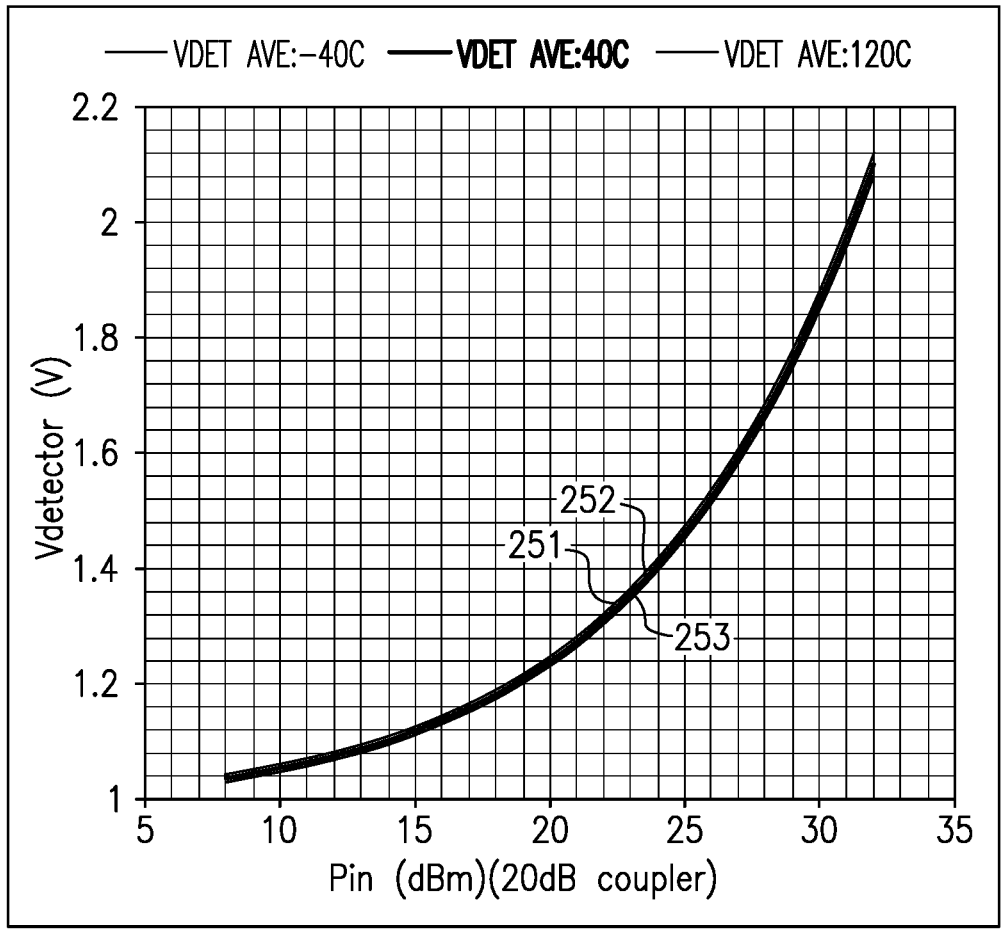
FIG. 9 shows examples of simulation results for the power detector of FIG. 4, where the simulation is performed to separate temperature effects from process variation effects.

FIG. 9 shows examples of simulation results for the power detector 100 of FIG. 4, where the simulation is performed to separate temperature effects from process variation effects. In FIG. 9, output voltage (Vdetector) of the second detector (102 in FIG. 4, at the output 120) is plotted as a function of input signal power, for each of three example temperatures (−40 degrees C. indicated as curve 251, 40 degrees C. indicated as curve 252, 120 degrees C. indicated as curve 253). One can see that there is very little shift or any other variation in the power detector response over a wide range of operating temperature.

Figure 10:
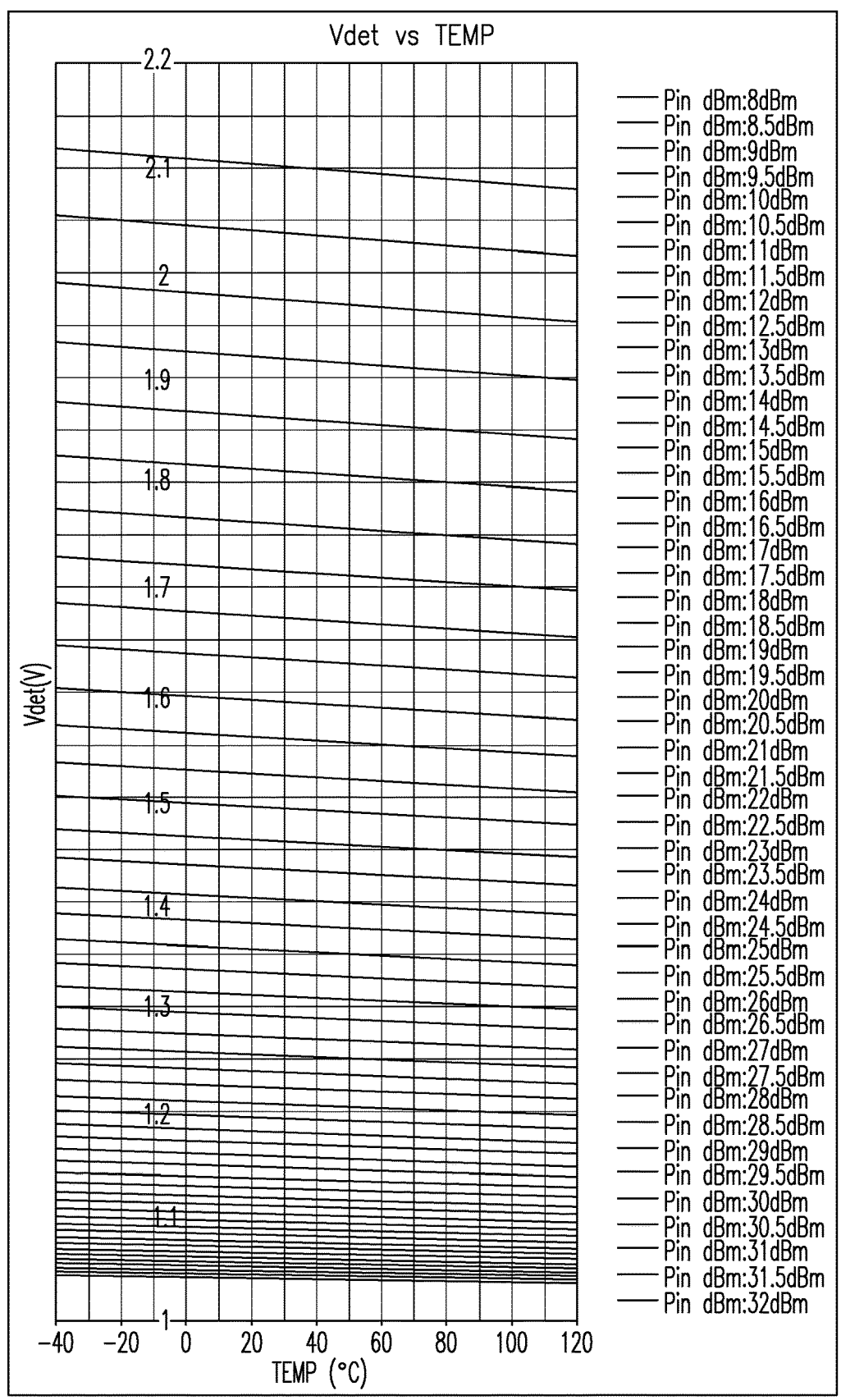
FIG. 10 shows very low temperature dependent variation for the simulation results of FIG. 7.

Such very low temperature dependent variation in the detected output voltage (Vdetector in FIG. 9, and Vdet in FIG. 10) is depicted in FIG. 10. In the example of FIG. 10, a number of Vdet curves are shown as a function of temperature between −40 degrees C. and 120 degrees C. Again, one can see that there is very low temperature dependent variation in the detected output voltage among various input power settings.

Figure 11:
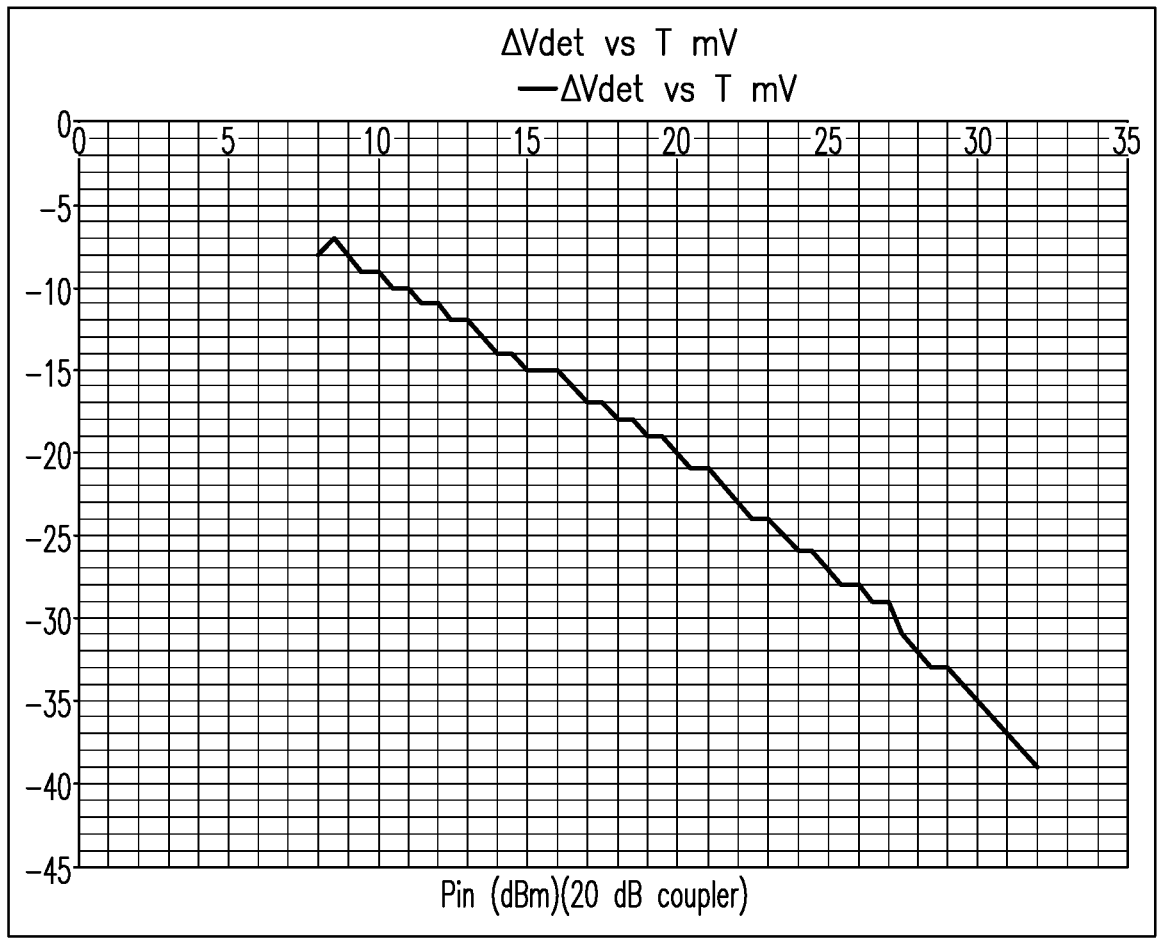
FIG. 11 shows a plot of detector voltage variation as a function of temperature.
Figure 12:
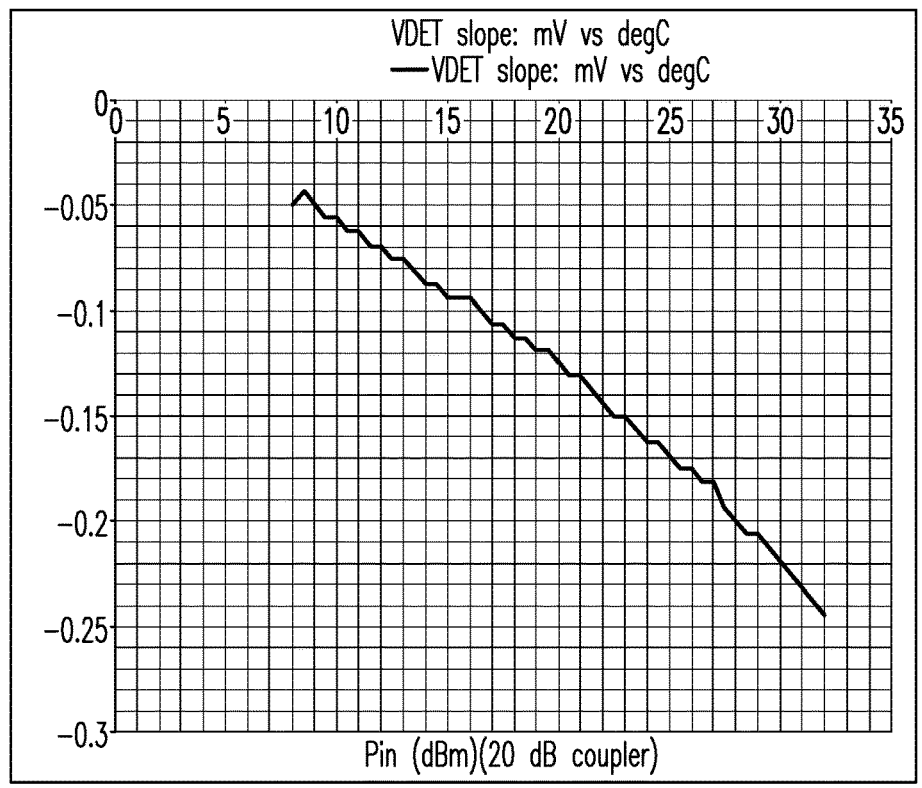
FIG. 12 shows a plot of detector voltage slope as a function of temperature.
Figure 13:
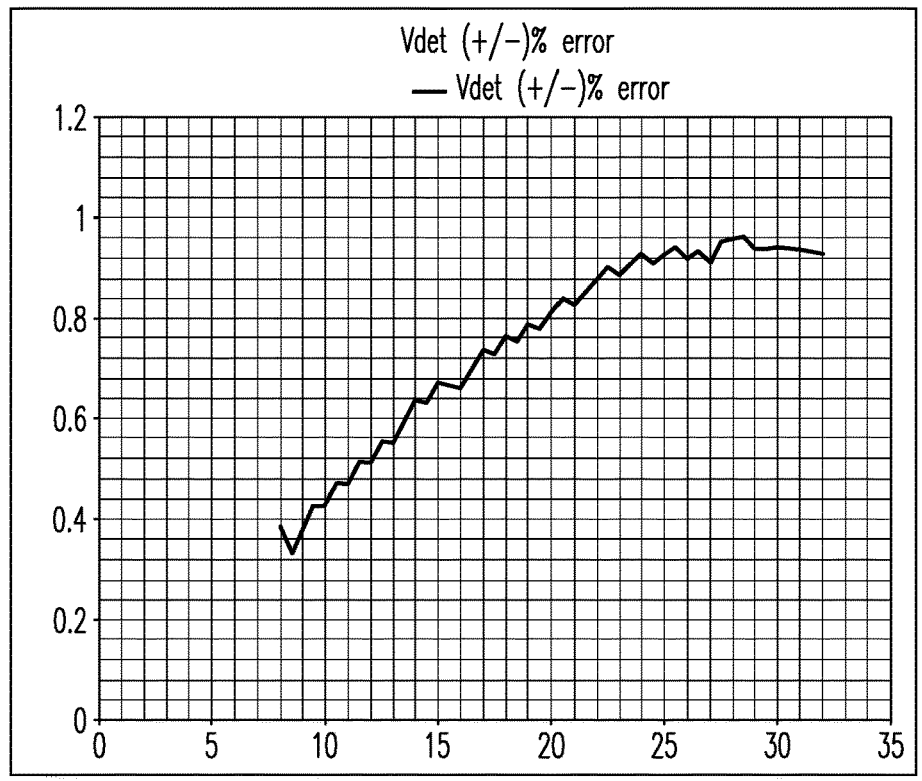
FIG. 13 shows a plot of detector voltage error as a function of temperature.

FIGS. 11-13 are additional examples of simulation results that show that the detected output voltage (Vdetector in FIG. 9, and Vdet in FIG. 10) has very low temperature dependent variation. The examples also show that the temperature dependent variation changes with the input signal power level. More particularly, FIG. 11 shows a plot of detector voltage variation as a function of temperature, FIG. 12 shows a plot of detector voltage slope as a function of temperature, and FIG. 13 shows a plot of detector voltage error as a function of temperature.

Figure 14:
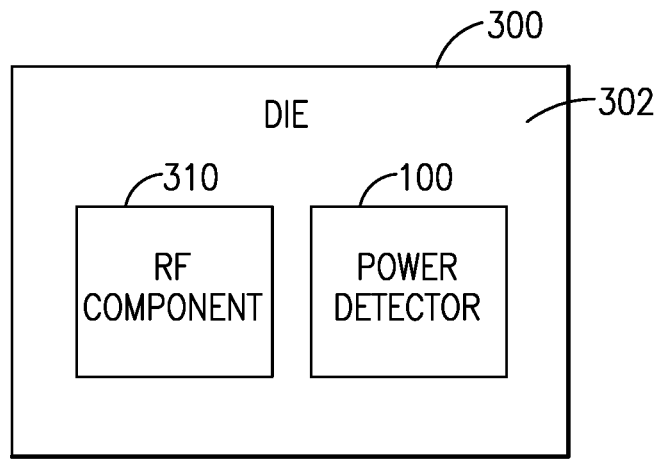
FIG. 14 shows that in some embodiments, a semiconductor die can include a radio-frequency (RF) component and a power detector.

FIGS. 14-17 show various examples of products having one or more features as described herein. For example, FIG. 14 shows that in some embodiments, a semiconductor die 300 having a substrate 302 can include an RF component 310 for which power measurement is desired. The die 300 can further include a power detector 100 having one or more features as described herein, and such a power detector can be utilized to measure power associated with the RF component 310.

Figure 15:
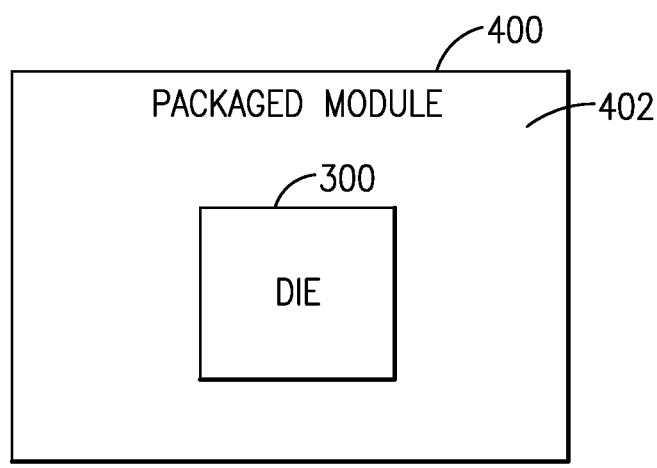
FIG. 15 shows that in some embodiments, a packaged module can include a die similar to the example of FIG. 14.
Figure 16:
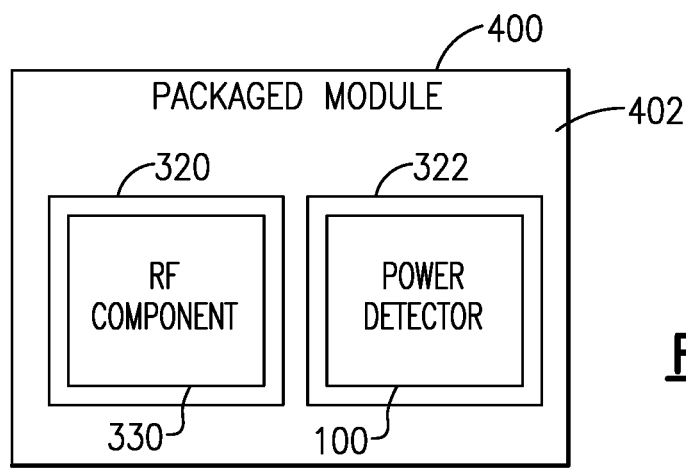
FIG. 16 shows that in some embodiments, a packaged module can include a first die having an RF component for which power measurement is desired, and a second die having a power detector as described herein.

FIGS. 15 and 16 show that in some embodiments, a packaged module 400 can include one or more features as described herein. Such a packaged module typically includes a packaging substrate 402 configured to support a plurality components such as die and other circuit elements. FIG. 15 shows that in some embodiments, the packaged module 400 can include a die 300 similar to the example of FIG. 14. FIG. 16 shows that in some embodiments, the packaged module 400 can include a first die 320 having an RF component 330 for which power measurement is desired. In the example of FIG. 16, the packaged module 400 can further include a second die 300 having a power detector as described herein. Such a power detector can be utilized to measure the power associated with the RF component 330.

It is noted that in some embodiments, RF filtering of the detector output can be implemented on a product such as a module, so that a user of the product has maximum or increased control of filtering and time constants associated with power detection. It is also noted that in some embodiments, RF matching can be omitted in a die implementation, to allow setting of appropriate impedance on a module that includes the die. Such a configuration can also minimize or reduce a series capacitance value on the module to allow for turn on/off time constant tuning and minimization.

Figure 17:
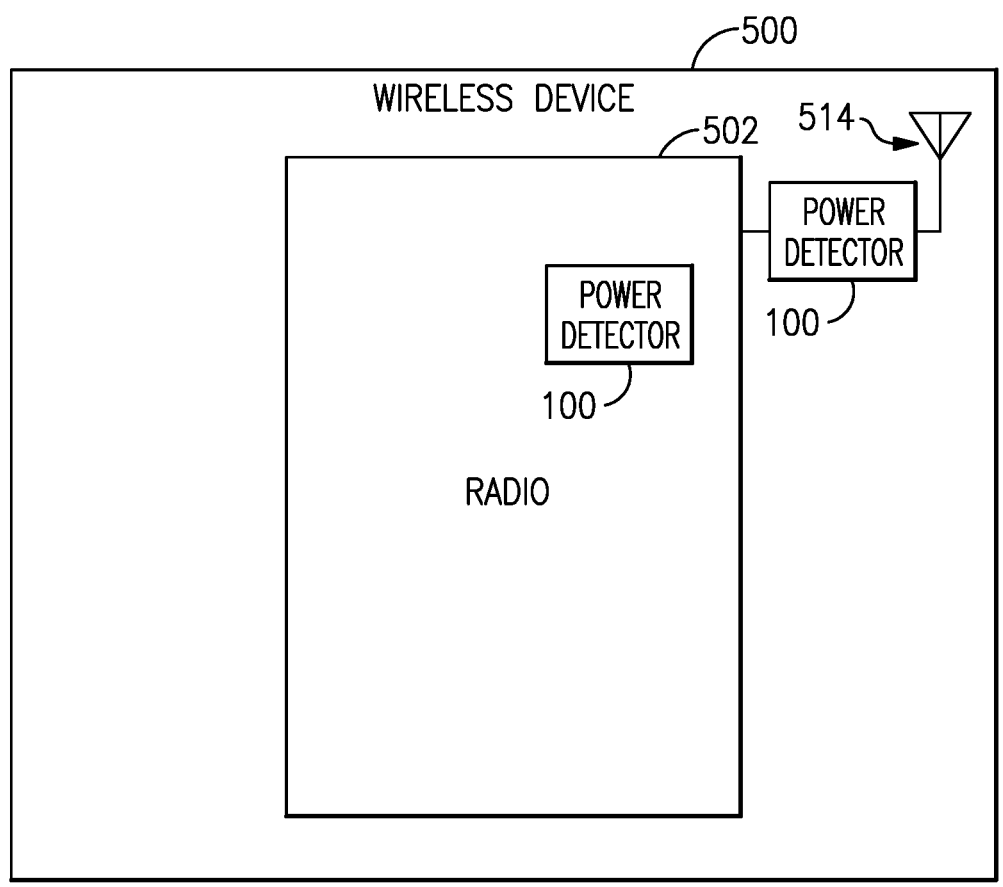
FIG. 17 shows that a wireless device can include one or more power detectors as described herein.

FIG. 17 shows that a wireless device 500 can include one or more power detectors 100 as described herein. In the example of FIG. 17, the wireless device 500 is shown to include a radio circuit 502 coupled to an antenna 514. Such a radio circuit can be configured to provide transmit and/or receive functionalities.

FIG. 17 shows that in some embodiments, a power detector 100 having one or more features as described herein can be implemented as a part of the radio circuit 502. FIG. 17 also shows that in some embodiments, a power detector 100 having one or more features as described herein can be implemented at other locations of the wireless device 500. For example, a power detector 100 can be implemented between the radio circuit 502 and the antenna 514 to monitor the power of signal being transmitted or received.

In some embodiments, a power detector having one or more features as described herein can be implemented in different products, including those examples provided herein. Such products can include, or be associated with, any front-end system or module in which power detection is desired. Such a front-end module or system can be configured to support wireless operations involving, for example, cellular devices, WLAN devices, IoT devices, etc.

The present disclosure describes various features, no single one of which is solely responsible for the benefits described herein. It will be understood that various features described herein may be combined, modified, or omitted, as would be apparent to one of ordinary skill. Other combinations and sub-combinations than those specifically described herein will be apparent to one of ordinary skill, and are intended to form a part of this disclosure. Various methods are described herein in connection with various flowchart steps and/or phases. It will be understood that in many cases, certain steps and/or phases may be combined together such that multiple steps and/or phases shown in the flowcharts can be performed as a single step and/or phase. Also, certain steps and/or phases can be broken into additional sub-components to be performed separately. In some instances, the order of the steps and/or phases can be rearranged and certain steps and/or phases may be omitted entirely. Also, the methods described herein are to be understood to be open-ended, such that additional steps and/or phases to those shown and described herein can also be performed.

Some aspects of the systems and methods described herein can advantageously be implemented using, for example, computer software, hardware, firmware, or any combination of computer software, hardware, and firmware. Computer software can comprise computer executable code stored in a computer readable medium (e.g., non-transitory computer readable medium) that, when executed, performs the functions described herein. In some embodiments, computer-executable code is executed by one or more general purpose computer processors. A skilled artisan will appreciate, in light of this disclosure, that any feature or function that can be implemented using software to be executed on a general purpose computer can also be implemented using a different combination of hardware, software, or firmware. For example, such a module can be implemented completely in hardware using a combination of integrated circuits. Alternatively or additionally, such a feature or function can be implemented completely or partially using specialized computers designed to perform the particular functions described herein rather than by general purpose computers.

Multiple distributed computing devices can be substituted for any one computing device described herein. In such distributed embodiments, the functions of the one computing device are distributed (e.g., over a network) such that some functions are performed on each of the distributed computing devices.

Some embodiments may be described with reference to equations, algorithms, and/or flowchart illustrations. These methods may be implemented using computer program instructions executable on one or more computers. These methods may also be implemented as computer program products either separately, or as a component of an apparatus or system. In this regard, each equation, algorithm, block, or step of a flowchart, and combinations thereof, may be implemented by hardware, firmware, and/or software including one or more computer program instructions embodied in computer-readable program code logic. As will be appreciated, any such computer program instructions may be loaded onto one or more computers, including without limitation a general purpose computer or special purpose computer, or other programmable processing apparatus to produce a machine, such that the computer program instructions which execute on the computer(s) or other programmable processing device(s) implement the functions specified in the equations, algorithms, and/or flowcharts. It will also be understood that each equation, algorithm, and/or block in flowchart illustrations, and combinations thereof, may be implemented by special purpose hardware-based computer systems which perform the specified functions or steps, or combinations of special purpose hardware and computer-readable program code logic means.

Furthermore, computer program instructions, such as embodied in computer-readable program code logic, may also be stored in a computer readable memory (e.g., a non-transitory computer readable medium) that can direct one or more computers or other programmable processing devices to function in a particular manner, such that the instructions stored in the computer-readable memory implement the function(s) specified in the block(s) of the flowchart(s). The computer program instructions may also be loaded onto one or more computers or other programmable computing devices to cause a series of operational steps to be performed on the one or more computers or other programmable computing devices to produce a computer-implemented process such that the instructions which execute on the computer or other programmable processing apparatus provide steps for implementing the functions specified in the equation(s), algorithm(s), and/or block(s) of the flowchart(s).

Some or all of the methods and tasks described herein may be performed and fully automated by a computer system. The computer system may, in some cases, include multiple distinct computers or computing devices (e.g., physical servers, workstations, storage arrays, etc.) that communicate and interoperate over a network to perform the described functions. Each such computing device typically includes a processor (or multiple processors) that executes program instructions or modules stored in a memory or other non-transitory computer-readable storage medium or device. The various functions disclosed herein may be embodied in such program instructions, although some or all of the disclosed functions may alternatively be implemented in application-specific circuitry (e.g., ASICs or FPGAs) of the computer system. Where the computer system includes multiple computing devices, these devices may, but need not, be co-located. The results of the disclosed methods and tasks may be persistently stored by transforming physical storage devices, such as solid state memory chips and/or magnetic disks, into a different state.

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list. The word "exemplary" is used exclusively herein to mean "serving as an example, instance, or illustration." Any implementation described herein as "exemplary" is not necessarily to be construed as preferred or advantageous over other implementations.

The disclosure is not intended to be limited to the implementations shown herein. Various modifications to the implementations described in this disclosure may be readily apparent to those skilled in the art, and the generic principles defined herein may be applied to other implementations without departing from the spirit or scope of this disclosure. The teachings of the invention provided herein can be applied to other methods and systems, and are not limited to the methods and systems described above, and elements and acts of the various embodiments described above can be combined to provide further embodiments. Accordingly, the novel methods and systems described herein may be embodied in a variety of other forms; furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. A power detector comprising:
a first detection cell including a first emitter follower detector having a base, a collector and an emitter, the first detection cell configured such that the base only receives a bias voltage, the collector is only coupled to a supply node, and the emitter provides an output;
a second detection cell including a second emitter follower detector having a base, a collector and an emitter, the second detection cell configured such that the base receives a bias voltage and a radio-frequency signal, the collector is coupled to a supply node and a filter capacitance, and the emitter provides an output; and
an error amplifier having a first input coupled to the output of the first emitter follower detector, a second input for receiving a reference voltage, and an output coupled to the base of each of the first and second emitter follower detectors, such that the bias voltage provided to the base of the first emitter follower detector is representative of an output voltage of the error amplifier and is the same as the bias voltage provided to the base of the second emitter follower detector.

2. The power detector of claim 1 wherein the first detection cell and the second detection cell are substantially identical other than the first detection cell not receiving the radio-frequency signal and the second detection cell receiving the radio-frequency signal.

3. The power detector of claim 1 wherein the error amplifier includes a first transistor having a base coupled to the first input, a collector coupled to a supply circuit, and an emitter, the error amplifier further including a second transistor having a base coupled to the second input, a collector coupled to the supply circuit, and an emitter coupled to the emitter of the first transistor.

4. The power detector of claim 3 wherein the collector of the first transistor is configured to provide the output voltage of the error amplifier.

5. The power detector of claim 4 wherein the error amplifier further includes an output capacitance that couples the collector of the first transistor to ground.

6. The power detector of claim 3 wherein the supply circuit includes a first transistor and a second transistor each having a source, a gate and a drain, the source of each of the first and second transistors coupled to a regulated voltage node, the gates of the first and second transistors coupled to each other and to the drain of the first transistor.

7. The power detector of claim 6 wherein the drain of the first transistor of the supply circuit is coupled to the collector of the first transistor of the error amplifier, and the drain of the second transistor of the supply circuit is coupled to the collector of the second transistor of the error amplifier.

8. The power detector of claim 1 wherein the reference voltage includes a regulated voltage based on a bandgap voltage.

9. The power detector of claim 1 wherein the emitter of the second emitter follower detector is configured to provide an output that is representative of power of the radio-frequency signal with an adjustment for either or both of a temperature variation and a process variation.

10. A semiconductor die comprising:
a semiconductor substrate; and
a power detector implemented on the semiconductor substrate, the power detector including a first detection cell including a first emitter follower detector having a base, a collector and an emitter, the first detection cell configured such that the base only receives a bias voltage, the collector is only coupled to a supply node, and the emitter provides an output, the power detector further including a second detection cell including a second emitter follower detector having a base, a collector and an emitter, the second detection cell configured such that the base receives a bias voltage and a radio-frequency signal, the collector is coupled to a supply node and a filter capacitance, and the emitter provides an output, the power detector further including an error amplifier having a first input coupled to the output of the first emitter follower detector, a second input for receiving a reference voltage, and an output coupled to the base of each of the first and second emitter follower detectors, such that the bias voltage provided to the base of the first emitter follower detector is representative of an output voltage of the error amplifier and is the same as the bias voltage provided to the base of the second emitter follower detector.

11. A packaged module comprising:
a packaging substrate configured to receive a plurality of components; and
a power detector implemented on the packaging substrate, the power detector including a first detection cell including a first emitter follower detector having a base, a collector and an emitter, the first detection cell configured such that the base only receives a bias voltage, the collector is only coupled to a supply node, and the emitter provides an output, the power detector further including a second detection cell including a second emitter follower detector having a base, a collector and an emitter, the second detection cell configured such that the base receives a bias voltage and a radio-frequency signal, the collector is coupled to a supply node and a filter capacitance, and the emitter provides an output, the power detector further including an error amplifier having a first input coupled to the output of the first emitter follower detector, a second input for receiving a reference voltage, and an output coupled to the base of each of the first and second emitter follower detectors, such that the bias voltage provided to the base of the first emitter follower detector is representative of an output voltage of the error amplifier and is the same as the bias voltage provided to the base of the second emitter follower detector.

12. The packaged module of claim 11 further including a radio-frequency circuit associated with the radio-frequency signal.

13. The packaged module of claim 12 wherein both of the power detector and the radio-frequency circuit are implemented on a single semiconductor die.

14. The packaged module of claim 12 wherein the power detector is implemented on a first semiconductor die, and the radio-frequency circuit is implemented on a second semiconductor die.

* * * * *